(12) United States Patent
Li et al.

(10) Patent No.: US 10,475,889 B1
(45) Date of Patent: Nov. 12, 2019

(54) GALLIUM NITRIDE POWER AMPLIFIER INTEGRATION WITH METAL-OXIDE-SEMICONDUCTOR DEVICES

(71) Applicant: QUALCOMM Incorporated, San Diego, CA (US)

(72) Inventors: Xia Li, San Diego, CA (US);
Gengming Tao, San Diego, CA (US);
Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/997,991

(22) Filed: Jun. 5, 2018

(51) Int. Cl.
| | | |
|---|---|---|
| *H01L 29/20* | (2006.01) |
| *H01L 29/66* | (2006.01) |
| *H03F 3/21* | (2006.01) |
| *H01L 29/08* | (2006.01) |
| *H01L 29/78* | (2006.01) |

(52) U.S. Cl.
CPC ...... *H01L 29/2003* (2013.01); *H01L 29/0847* (2013.01); *H01L 29/66803* (2013.01); *H01L 29/785* (2013.01); *H03F 3/21* (2013.01)

(58) Field of Classification Search
None
See application file for complete search history.

(56) References Cited

U.S. PATENT DOCUMENTS

| | | |
|---|---|---|
| 5,760,440 A | 6/1998 | Kitamura et al. |
| 7,420,226 B2 | 9/2008 | Augustine et al. |
| 9,607,876 B2 | 3/2017 | Lidow et al. |
| 9,917,089 B2 | 3/2018 | Jagannathan et al. |
| 2015/0076591 A1 | 3/2015 | Meyer et al. |

(Continued)

FOREIGN PATENT DOCUMENTS

| | | |
|---|---|---|
| WO | WO-2016209263 A1 | 12/2016 |
| WO | WO-2017171829 A1 | 10/2017 |

OTHER PUBLICATIONS

Fraunhofer, "Power Amplifiers for 5G Made of Gallium Nitride," Research News, Aug. 2016, pp. 1-3.

(Continued)

*Primary Examiner* — Jack S Chen
(74) *Attorney, Agent, or Firm* — Patterson & Sheridan, L.L.P

(57) ABSTRACT

Certain aspects of the present disclosure provide a semiconductor device. One example semiconductor device generally includes a substrate, a semiconductor region disposed adjacent to the substrate, first fin(s) disposed adjacent to the semiconductor region, first gate region(s) disposed adjacent to the first fin(s), first drain contact(s) disposed above the first fin(s), first source contact(s) disposed below the substrate, a second fin disposed above the semiconductor region, and a second gate region, second source contact and second drain contact disposed adjacent to the second fin and above the semiconductor region. First path(s) are formed between the first drain contact(s) and the first source contact(s) for current flow(s) through the first fin(s) in a vertical direction along the first path(s). A second path is formed between the second source contact and the second drain contact for current flow through the second fin in a horizontal direction along the second path.

19 Claims, 20 Drawing Sheets

(56) References Cited

U.S. PATENT DOCUMENTS

2017/0263708 A1  9/2017 Then et al.
2019/0259854 A1* 8/2019 Jagannathan ....... H01L 29/0653

OTHER PUBLICATIONS

Hardesty L., "Device Makes Power Conversion More Efficient," MIT News, Dec. 6, 2017, http://news.mit.edu/2017/device-makes-power-conversion-more-efficient-1207, pp. 1-3.
Nakamura S., et al., "Novel Metalorganic Chemical Vapor Deposition System for GaN growth," Applied Physics Letters, vol. 58, No. 18, May 6, 1991, pp. 2021-2023.
Shen S-C., et al., "GaN/InGaN Heterojunction Bipolar Transistors With fT 5 GHz," IEEE Electron Device Letters, vol. 32, No. 8, Aug. 2011, pp. 1065-1067.
International Search Report and Written Opinion—PCT/US2019/030994—ISA/EPO—dated Jul. 18, 2019.

\* cited by examiner

GALLIUM NITRIDE POWER AMPLIFIER INTEGRATION WITH METAL-OXIDE-SEMICONDUCTOR DEVICES

TECHNICAL FIELD

Certain aspects of the present disclosure generally relate to electronic circuits and, more particularly, to semiconductor devices.

BACKGROUND

Radio frequency (RF) components, such as power amplifiers (PAs), are important components found in the RF front-end system of modern mobile communication devices. Today, these RF components are generally built with gallium nitride (GaN)-based materials, e.g., to support high power, high speed, high frequency, etc. applications typically associated with fifth generation of wireless systems (5G) (or next generation) technology. Compared to silicon (Si) and other III-V materials, GaN typically has a higher bandgap, higher electron peak velocity, higher breakdown electric field, etc., making GaN suitable for 5G applications.

Complementary metal-oxide-semiconductor (CMOS) devices are fundamental components for integrated circuits to implement digital logic. A CMOS device typically includes a p-type metal-oxide-semiconductor (PMOS) transistor used to pull an output up to logic high and an n-type metal-oxide-semiconductor (NMOS) transistor used to pull the output down to logic low, depending on an input signal provided to the gates of the PMOS and NMOS transistors. These CMOS devices may be configured to control parameter(s) of RF components, such as PAs.

SUMMARY

Certain aspects of the present disclosure generally relate to a structure for a semiconductor device that allows for a vertical (e.g., three-dimensional (3D)) power amplifier (PA) and a horizontal (e.g., two-dimensional (2D)) metal-oxide-semiconductor (MOS) control logic device or horizontal complementary metal-oxide-semiconductor (CMOS) control logic device to be on the same wafer-level substrate.

Certain aspects of the present disclosure are directed to a semiconductor device. The semiconductor device generally includes a substrate, a semiconductor region disposed adjacent to the substrate, at least one first fin disposed adjacent to the semiconductor region, at least one first gate region disposed adjacent to the at least one first fin, at least one first drain contact disposed above the at least one first fin, and at least one first source contact disposed below the substrate. At least one first path is formed between the at least one first drain contact and the at least one first source contact for a first current flow through the at least one first fin in a vertical direction along the at least one first path. The semiconductor device also includes a second fin disposed above the semiconductor region, at least one second gate region disposed adjacent to the second fin, and a second source contact and a second drain contact disposed adjacent to the second fin and above the semiconductor region. A second path is formed between the second source contact and the second drain contact for a second current flow through the second fin in a first horizontal direction along the second path.

Certain aspects of the present disclosure are directed to a method for fabricating a semiconductor device. The method generally includes forming a substrate, forming a semiconductor region adjacent to the substrate, forming at least one first fin adjacent to the semiconductor region, forming at least one first gate region adjacent to the at least one first fin, forming at least one first drain contact above the at least one first fin, and forming at least one first source contact below the substrate, such that at least one first path is formed between the at least one first drain contact and the at least one first source contact for a first current flow through the at least one first fin in a vertical direction along the at least one first path. The method also includes forming a second fin above the semiconductor region, forming at least one second gate region adjacent to the second fin, and forming a second source contact and a second drain contact adjacent to the second fin and above the semiconductor region, such that a second path is formed between the second source contact and the second drain contact for a second current flow through the second fin in a first horizontal direction along the second path.

Certain aspects of the present disclosure are directed to a power amplifier (PA) having an integrated control device. The PA includes a vertical fin field-effect transistor (FinFET) device and a horizontal metal-oxide-semiconductor (MOS) device. The vertical FinFET device and the horizontal MOS device are disposed on a same wafer-level substrate. The horizontal MOS device is configured to control at least one parameter of the vertical FinFET device.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
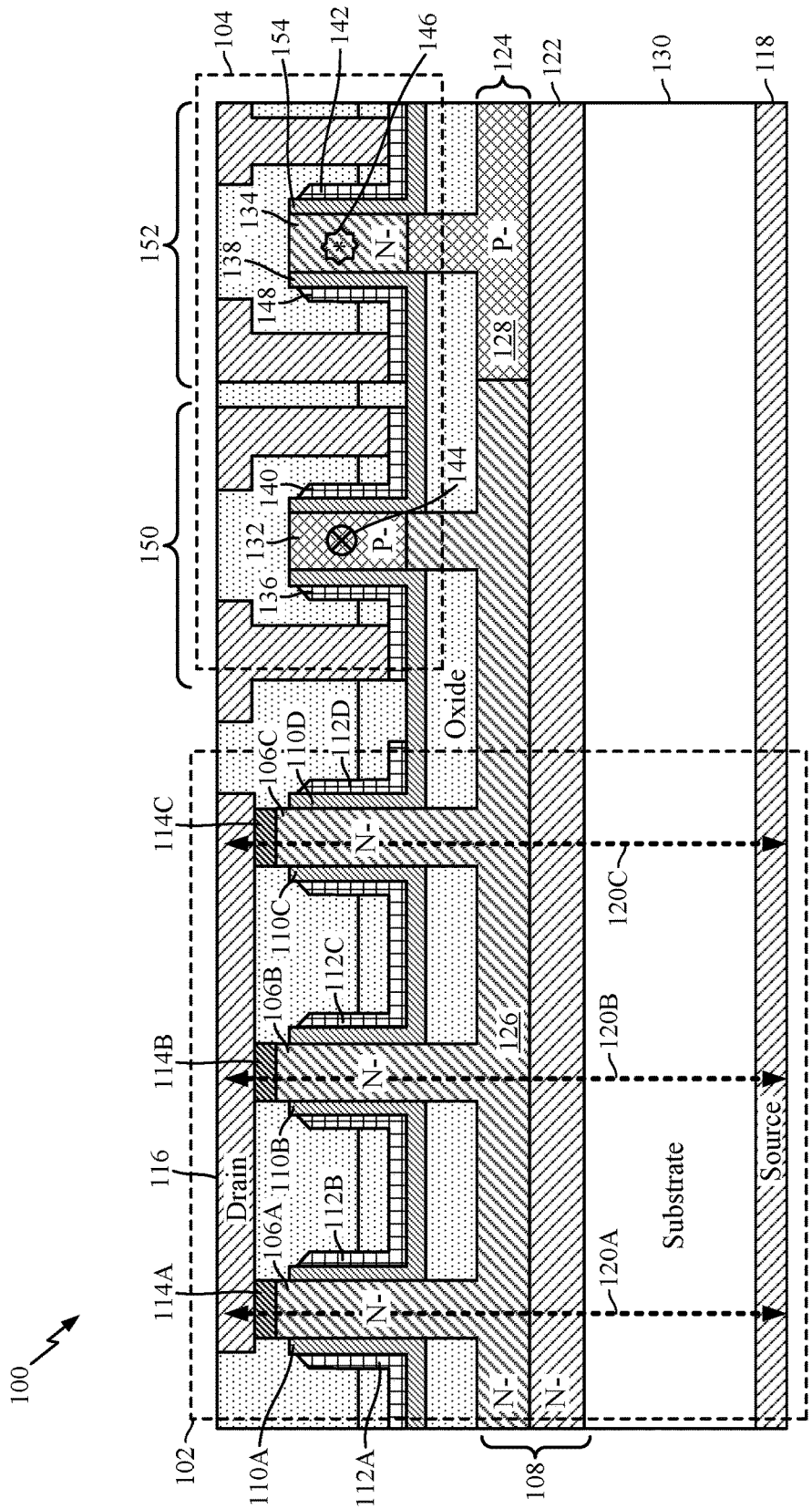
FIG. 1 illustrates a cross-sectional view of a semiconductor device having a vertical power amplifier (PA) device and complementary metal-oxide-semiconductor (CMOS) control logic device integrated on a same wafer-level substrate, in accordance with certain aspects of the present disclosure.

Certain aspects of the present disclosure are generally directed to metal-oxide-semiconductor (MOS)/complementary metal-oxide-semiconductor (CMOS) control logic device integration with a power amplifier (PA) device.

Devices that support fifth generation of wireless systems (5G) (or next generation) technology and millimeter wave (mmW) technology may be implemented with high frequency (e.g., greater than 6 gigahertz (GHz)) power amplifiers with low thermal effect/high thermal dissipation. However, conventional two-dimensional (2D) (e.g., horizontal) gallium nitride (GaN)-based PAs typically have a higher thermal effect/less thermal dissipation and a limited PA power efficiency. For example, within such lateral 2D devices, current generally flows through a narrow region of material (e.g., 50 nanometers in thickness) close to the surface. Current flow within such a narrow region can generate a substantial amount of heat in the narrow region, and in turn, substantially heat up the device. Three-dimensional (3D) (e.g., vertical) GaN-based PAs may provide a higher current, low thermal effect (e.g., higher thermal dissipation) and higher power efficiency compared to 2D GaN-based PAs. For example, within a vertical 3D device, the current generally flows through the entire wafer (e.g., as opposed to a narrow region close to the wafer surface), resulting in a more uniform heat dissipation throughout the device. However, while 3D GaN-based PAs may provide a lower thermal effect (e.g., greater thermal dissipation), 3D GaN-based PAs typically do not have in-chip control logic. Further, using an outside high-voltage control signal to control the 3D GaN-based PAs can result in less efficiency.

Certain aspects presented herein provide a semiconductor structure that allows for a 3D PA device and a MOS/CMOS control logic device to be implemented on the same chip (e.g., share the same wafer-level substrate), e.g., for 5G and mmW applications.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Semiconductor Device

FIG. 1 illustrates a cross-sectional view of a semiconductor device 100 having a vertical PA 102 and horizontal CMOS device 104 integrated on the same wafer-level substrate, in accordance with certain aspects of the present disclosure. The horizontal CMOS device 104 may be configured to control one or more parameters (e.g., gate voltage, output power, etc.) of the vertical PA 102. As illustrated, the vertical PA 102 may be a vertical fin field-effect-transistor (FinFET) device implemented over a substrate 130. The vertical PA 102 may include one or more fins 106 (e.g., n− type fins), each disposed above and adjacent to a semiconductor region 108. In this example, the vertical PA 102 includes fins 106A, 106B, and 106C (collectively referred to as "fins 106") disposed adjacent to and above the semiconductor region 108, which is disposed on or above a substrate 130. Although three fins 106 are shown, the vertical PA 102 may include more or less than three fins. In some aspects, the substrate 130 may include gallium nitride (GaN). In some aspects, the substrate 130 may have a thickness between approximately 100 and 300 micrometers (μm).

The semiconductor region 108 may include at least one of GaN, aluminum gallium nitride (AlGaN), or indium gallium nitride (InGaN). The semiconductor region 108 includes a semiconductor layer 122 (e.g., with n− doping) disposed on or otherwise above substrate 130, and a semiconductor layer 124 disposed on or otherwise above semiconductor layer 122. In some aspects, the semiconductor layer 122 may include n-doped GaN. The semiconductor layer 124 includes a semiconductor portion 126 (e.g., with n− doping) and a semiconductor portion 128 (e.g., with p− doping). Fins 106A, 106B, and 106C may be disposed on or otherwise above the semiconductor portion 126 of the semiconductor layer 124 of the semiconductor region 108. In some aspects, the semiconductor portion 126 may include n− doped GaN. In some aspects, the semiconductor portion 128 may include p− doped AlGaN, p− doped InGaN and/or Mg doped P-GaN. In some aspects, the semiconductor portions 126 and 128 may have the same or different thicknesses. In some cases, the semiconductor portion 126 and/or semiconductor portion 128 may have a thickness approximately equal to 6 μm.

Each fin 106A, 106B, and 106C may be disposed adjacent to or between a pair of gate regions. For example, fin 106A is disposed adjacent to or between gate regions 112A and 112B, fin 106B is disposed adjacent to or between gate regions 112B and 112C, and fin 106C is disposed adjacent to or between gate regions 112C and 112D. Gate regions 112A, 112B, 112C, and 112D may be collectively referred to herein as "gate regions 112." In some aspects, one or more of the gate regions 112 may be shared between adjacent fins 106. For example, gate region 112B is shared between fins 106A and 106B, and gate region 112C is shared between fins 106B and 106C.

Each fin 106A, 106B, and 106C may also be disposed adjacent to or between a pair of oxide regions (e.g., gate dielectric regions). For example, fin 106A is disposed adjacent to or between oxide regions 110A and 110B, fin 106B is disposed adjacent to or between oxide regions 110B and 110C, and fin 106C is disposed adjacent to or between oxide regions 110C and 110D. Oxide regions 110A, 110B, 110C, and 110D may be collectively referred to herein as "oxide regions 110." In some aspects, one or more of the oxide regions 110 may be shared between adjacent fins 106. For example, oxide region 110B is shared between fins 106A and 106B, and oxide region 110C is shared between fins 106B and 106C. The oxide regions 110 electrically isolate the fins 106 from the gate regions 112. In some aspects, as shown, at least one of the oxide regions 110 (e.g., oxide region 110D) may be shared between a fin (e.g., 106C) of the vertical PA 102 and a fin (e.g., fin 132) of the horizontal CMOS device 104. In this example, the oxide region 110D also electrically isolates the fin 132 from a gate region 136 disposed adjacent to fin 132. The horizontal CMOS device 104 is described in more detail below.

Non-insulative regions 114A, 114B, and 114C (e.g., each with n− doping) (collectively referred to as "non-insulative regions 114") are formed on and/or above the top of fins 106A, 106B, and 106C, respectively. As used herein, a non-insulative region (e.g., non-insulative gate region) generally refers to a region that may be conductive or semiconductive. In some aspects, each gate region 112A, 112B, 112C, and 112D may be a non-insulative region. The oxide regions 110A, 110B, 110C, and 110D may include any of various suitable dielectric materials, such as aluminum oxide ($Al_2O_3$).

The vertical PA 102 includes drain metallic contact(s) 116 and source metallic contact(s) 118. As shown, a drain metallic contact 116 is disposed on the non-insulative regions 114A, 114B, and 114C and disposed above the fins 106A, 106B, and 106C. In some aspects, a separate drain metallic contact 116 may be disposed above each fin 106A, 106B, and 106C. The source metallic contact(s) 118 are disposed below the substrate 130. As shown, paths 120A, 120B, and 120C (collectively referred to as "paths 120") are formed between the drain metallic contact(s) 116 and source metallic contact(s) 118. A current may flow through each fin 106A, 106B, and 106C in a vertical direction along the paths 120A, 120B, and 120C, respectively. Thus, the fins 106, the semiconductor region 108, and the gate regions 112 form a vertical FinFET device for the vertical PA 102.

The horizontal CMOS device 104 includes a FinFET p-type metal-oxide-semiconductor (PMOS) device 150 and a FinFET n-type metal-oxide-semiconductor (NMOS) device 152 implemented over the same substrate 130 as the vertical PA 102, as illustrated. The horizontal CMOS device 104 includes a fin 132 (e.g., p− type fin) and a fin 134 (e.g., n− type fin), each disposed on or otherwise above the semiconductor region 108. In particular, fin 132 is disposed on or otherwise above semiconductor portion 126 of the semiconductor layer 122 of the semiconductor region 108, and fin 134 is disposed on or otherwise above semiconductor portion 128 of the semiconductor layer 122 of the semiconductor region 108.

Fin 132 is further disposed adjacent to or between gate regions 136 and 140, and adjacent to or between oxide regions 110D and 138. Fin 134 is further disposed adjacent to or between gate regions 148 and 142, and adjacent to or between oxide regions 138 and 154. The oxide regions 110D and 138 electrically isolate the fin 132 from the gate regions 136 and 140, and the oxide regions 138 and 154 electrically isolate the fin 134 from the gate regions 148 and 142. The oxide regions 110D, 138, and 154 may include any of various suitable dielectric materials, such as $Al_2O_3$. In some aspects, each gate region 136, 140, 148, and 142 may be a non-insulative region.

Although not shown in this cross-sectional view of the semiconductor device 100, each fin 132 and 134 includes a source metallic contact and a drain metallic contact disposed adjacent to the respective fin and disposed above the semiconductor region 108. The drain metallic contact (not shown) and the source metallic contact (not shown) for each respective fin are disposed on opposite ends of the fin, which extends along an axis perpendicular to the planar cross-sectional view of FIG. 1. A path 144 (e.g., along an axis perpendicular to FIG. 1) is formed between the drain metallic contact and the source metallic contact disposed adjacent to fin 132 for a current flow through fin 132 in a (e.g., first) horizontal direction along the path 144. A path 146 (e.g., along an axis perpendicular to FIG. 1) is formed between the drain metallic contact and the source metallic contact disposed adjacent to fin 134 for a current flow through fin 134 in a (e.g., second) horizontal direction along the path 146. Thus, fins 132 and 134, the semiconductor region 108, and the gate regions 136, 140, 142, and 148 form a horizontal CMOS control logic device.

In some aspects, the horizontal direction for the current flow through fin 132 along path 144 and the horizontal direction for the current flow through fin 134 along path 146 may be antiparallel horizontal directions. For example, as indicated by the symbols in FIG. 1, the horizontal direction for the current flow through fin 132 along path 144 is into the page, and the horizontal direction for the current flow through fin 134 along path 146 is out of the page. Both paths 144 and 146 are perpendicular to the paths 120. While not shown, in some aspects, the horizontal direction for the current flow through fin 132 along path 144 and the horizontal direction for the current flow through fin 134 along path 146 may be the same horizontal direction (e.g., both into the page or both out of the page, along an axis perpendicular to the plane of FIG. 1).

Figure 2:
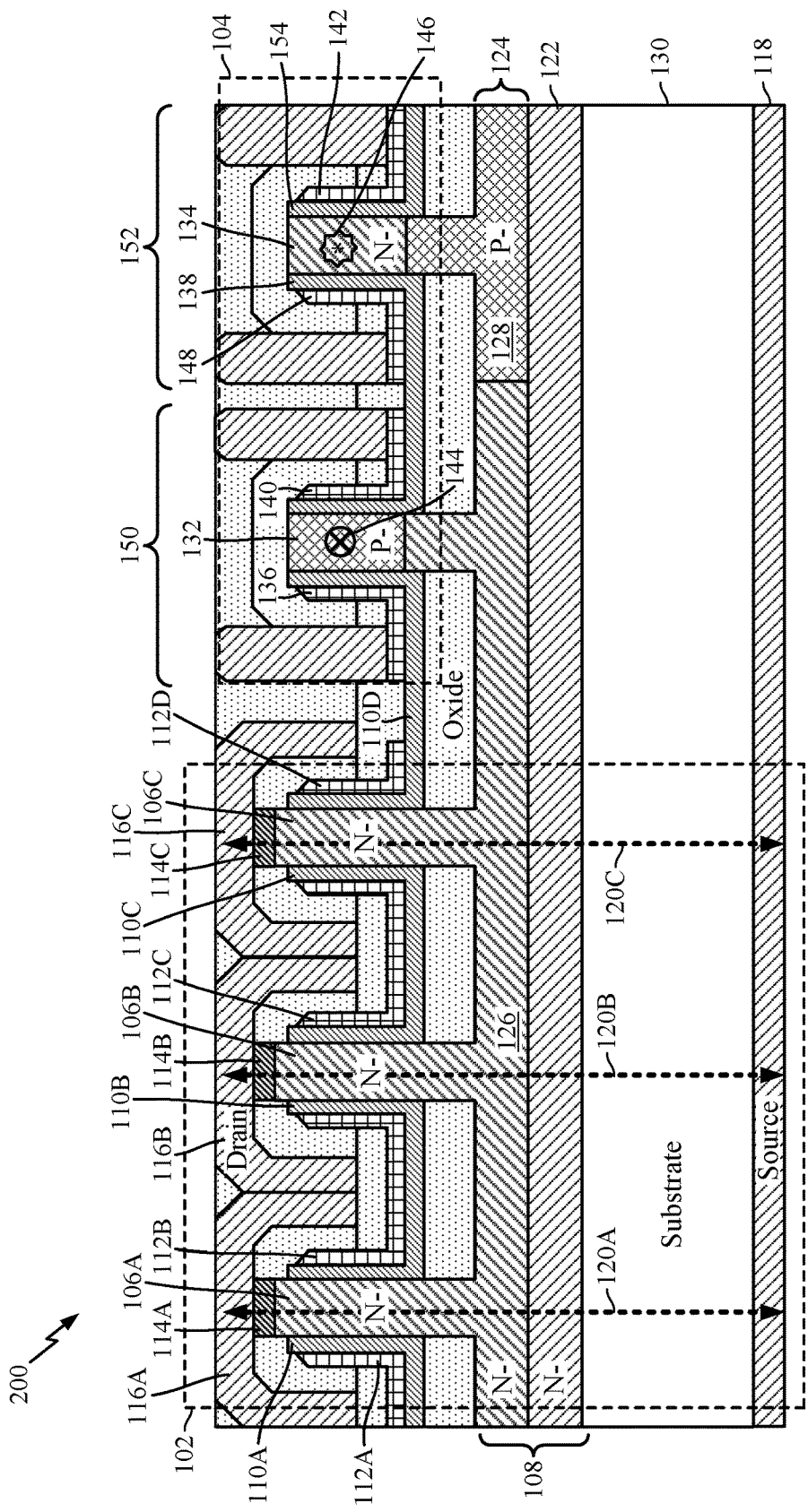
FIG. 2 illustrates a cross-sectional view of a semiconductor device having a vertical PA device and CMOS control logic device integrated on a same wafer-level substrate with metal patterning of the vertical PA device and CMOS control logic device, in accordance with certain aspects of the present disclosure.

FIG. 2 illustrates a cross-sectional view of a semiconductor device 200 having a vertical PA 102 and horizontal CMOS device 104 integrated on the same wafer-level substrate, in accordance with certain aspects of the present disclosure. Here, the semiconductor device 200 is similar to the semiconductor device 100, but the drain metallic contacts 116A, 116B, and 116C disposed above fins 106A, 106B, and 106C, respectively, are patterned. For example, as opposed to forming a single, planar metallic contact (e.g., drain metallic contact 116 in FIG. 1) disposed on or otherwise above fins 106, the drain metallic contacts 116A, 116B, and 116C in FIG. 2 may be formed adjacent to at least three sides of fins 106A, 106B, and 106C, respectively.

Figure 3:
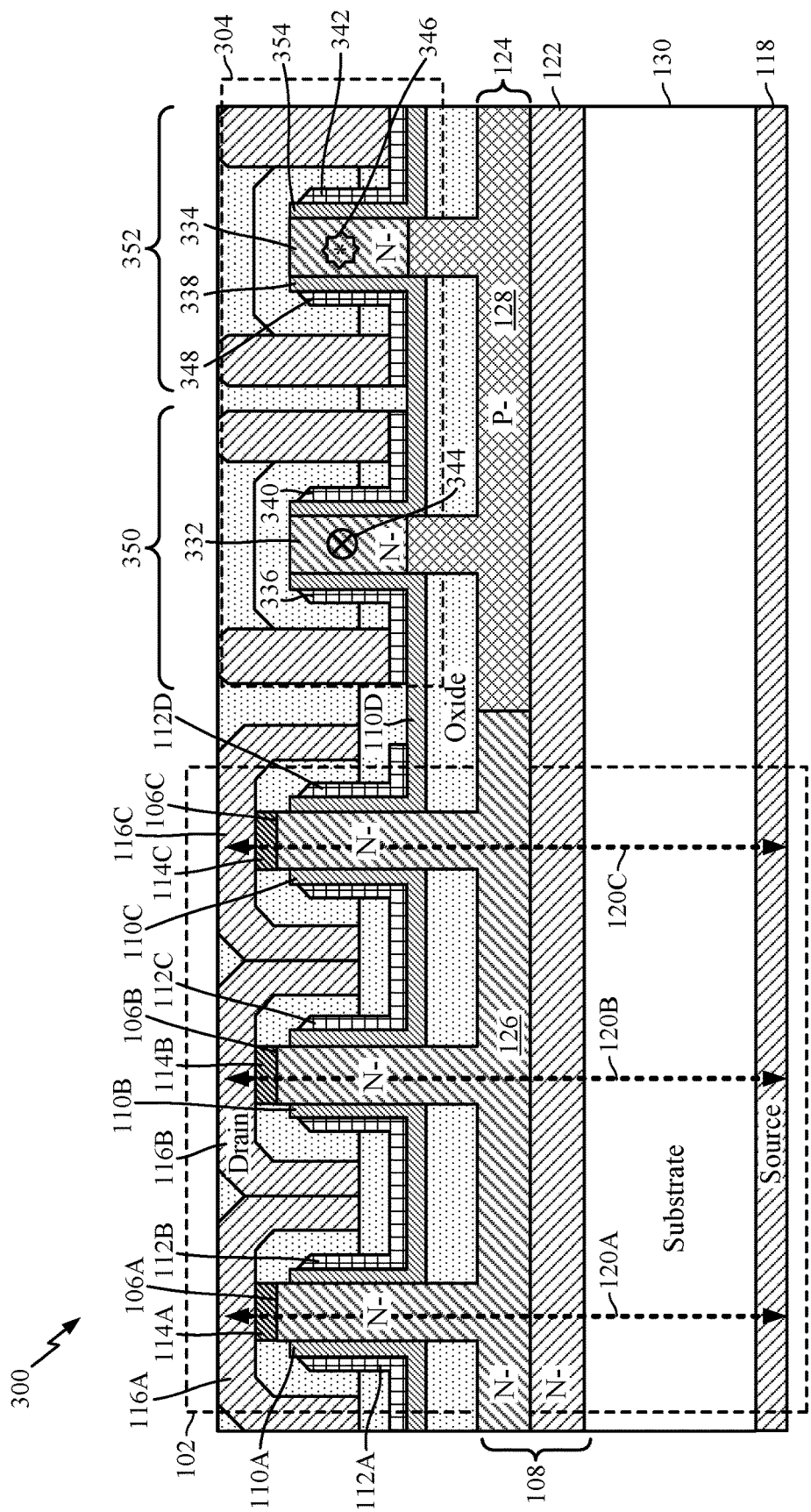
FIG. 3 illustrates a cross-sectional view of a semiconductor device having a vertical PA device and a metal-oxide-semiconductor (MOS) control logic device integrated on a same wafer-level substrate, where the MOS control logic device is implemented as two N-type MOS devices, in accordance with certain aspects of the present disclosure.

FIG. 3 illustrates a cross-sectional view of a semiconductor device 300 having a vertical PA 102 and horizontal MOS device 304, in accordance with certain aspects of the present disclosure. Here, the vertical PA 102 of the semiconductor device 300 is similar to the vertical PA 102 of the semiconductor device 200 in FIG. 2, but could also be similar to the vertical PA 102 of the semiconductor device 100 in FIG. 1. The horizontal MOS device 304 includes a FinFET NMOS device 350 and a FinFET NMOS device 352, both implemented over the same substrate 130 as the vertical PA 102, as illustrated.

The horizontal MOS device 304 includes a fin 332 (e.g., n− type fin) and a fin 334 (e.g., n− type fin), each disposed on or otherwise above the semiconductor region 108. In particular, fins 332 and 334 are disposed on or otherwise above the semiconductor portion 128 of the semiconductor layer 124 of the semiconductor region 108. Fin 332 is further disposed adjacent to or between gate regions 336 and 340, and adjacent to or between oxide regions 110D and 338. Fin 334 is further disposed adjacent to or between gate regions 348 and 342, and adjacent to or between oxide regions 338 and 354. The oxide regions 110D and 338 electrically isolate the fin 332 from the gate regions 336 and 340, and the oxide regions 338 and 354 electrically isolate the fin 334 from the gate regions 348 and 342. The oxide regions 110D, 338, and 354 may include any of various suitable dielectric materials, such as $Al_2O_3$. In some aspects, each gate region 336, 340, 342, and 348 may be a non-insulative region.

Although not shown in this cross-sectional view of the semiconductor device 300, each fin 332 and 334 includes a source metallic contact and a drain metallic contact disposed adjacent to the respective fin and disposed above the semiconductor region 108. The drain metallic contact (not shown) and the source metallic contact (not shown) for each respective fin are disposed on opposite ends of the fin, which extends along an axis perpendicular to the planar cross-sectional view of FIG. 3. A path 344 (e.g., along an axis perpendicular to FIG. 3) is formed between the drain metallic contact and the source metallic contact disposed adjacent to fin 332 for a current flow through fin 332 in a (e.g., first) horizontal direction along the path 344. A path 346 (e.g., along an axis perpendicular to FIG. 3) is formed between the drain metallic contact and the source metallic contact disposed adjacent to fin 334 for a current flow through fin 334 in a (e.g., second) horizontal direction along the path 346. Thus, fins 332 and 334, the semiconductor region 108, and the gate regions 336, 340, 342, and 348 form a horizontal MOS control logic device.

As indicated by the symbols in FIG. 3, the horizontal direction for the current flow through fin 332 along path 344 is into the page, and the horizontal direction for the current flow through fin 334 along path 346 is out of the page. In some cases, however, the horizontal direction for the current flow through fin 332 along path 344 and the horizontal direction for the current flow through fin 334 along path 346 may be the same horizontal direction (e.g., both into the page, or both out of the page, along an axis perpendicular to the plane of FIG. 3). Both paths 344 and 346 are perpendicular to the paths 120.

Figure 4:
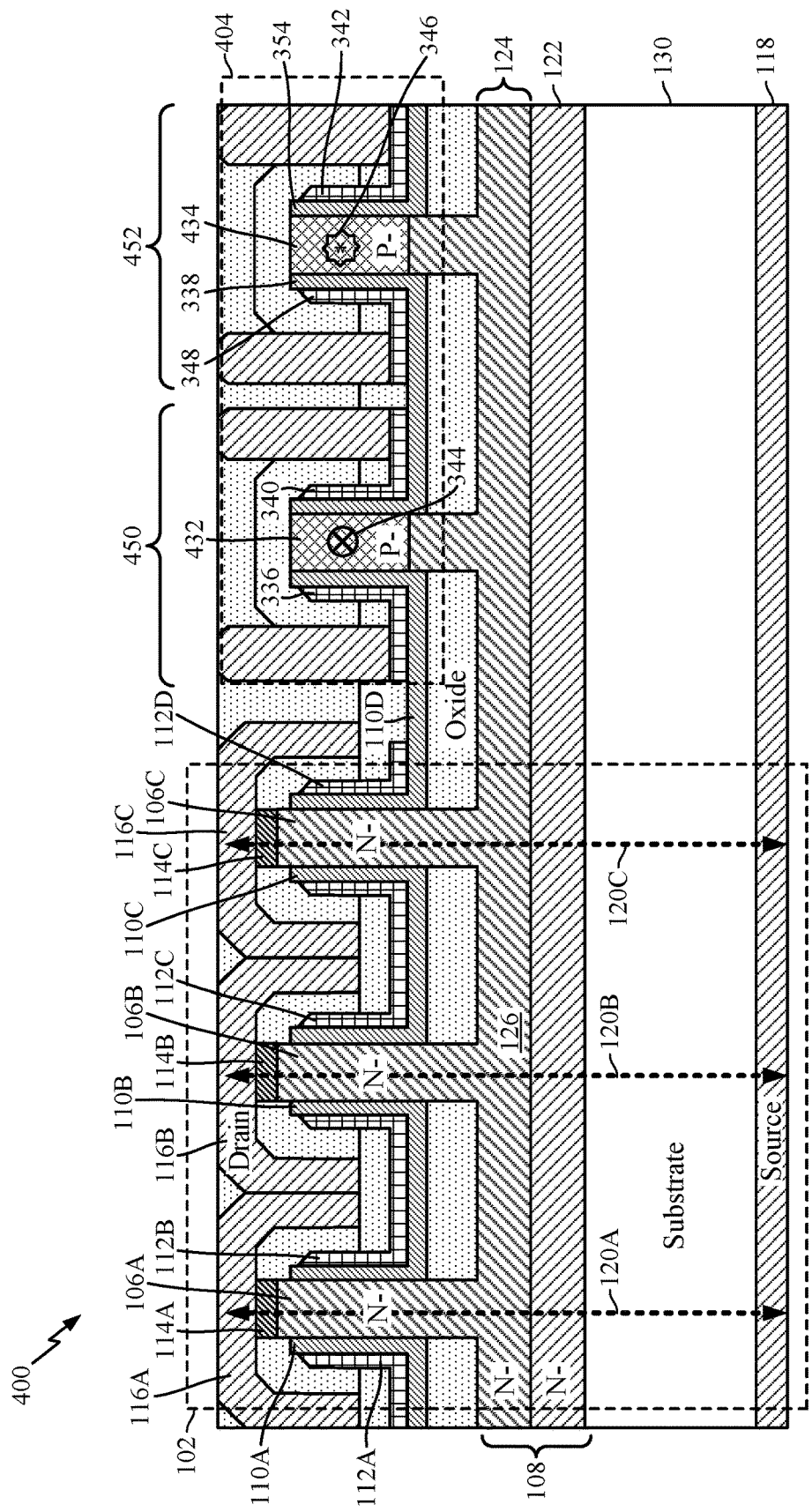
FIG. 4 illustrates a cross-sectional view of a semiconductor device having a vertical PA device and a MOS control logic device integrated on a same wafer-level substrate, where the MOS control logic device is implemented as two P-type MOS devices, in accordance with certain aspects of the present disclosure.

FIG. 4 illustrates a cross-sectional view of a semiconductor device 400 having a vertical PA 102 and a horizontal MOS device 404 integrated on the same wafer-level substrate, in accordance with certain aspects of the present disclosure. Here, the vertical PA 102 of the semiconductor device 400 is similar to the vertical PA 102 of the semiconductor device 200 in FIG. 2, but could also be similar to the vertical PA 102 of the semiconductor device 100 in FIG. 1. Additionally, the horizontal MOS device 404 is similar to the horizontal MOS device 304 of FIG. 3, but the FinFET NMOS devices 350 and 352 are replaced with FinFET PMOS devices 450 and 452, respectively. The horizontal MOS device 404 includes a fin 432 (e.g., p– type fin) and a fin 434 (e.g., p– type fin), each disposed on or otherwise above the semiconductor region 108. In particular, fins 432 and 434 are disposed on or otherwise above the semiconductor layer 124 (e.g., with n– doping) of the semiconductor region 108.

Figure 5A:
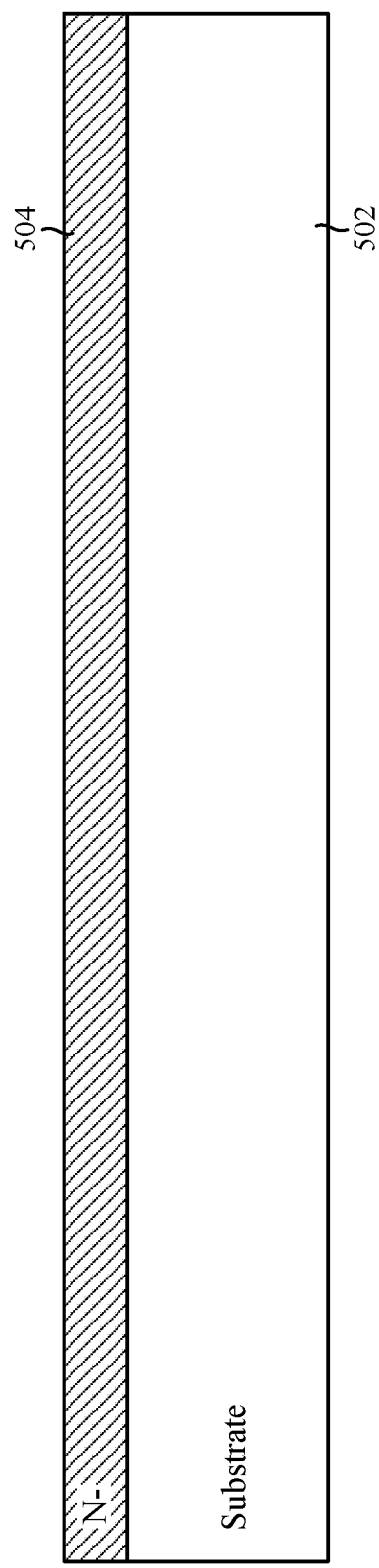
FIGS. 5A-5O illustrate example fabrication processes to implement a semiconductor device, in accordance with certain aspects of the present disclosure.

FIGS. 5A-5O illustrate example processes for fabricating the semiconductor device 200 of FIG. 2, in accordance with certain aspects of the present disclosure. Although these processes are illustrated and described herein for semiconductor device 200, the reader will understand that similar processes may be followed for fabricating any of the semiconductor devices 100, 300, and/or 400 by making appropriate adjustments and/or substitution of materials thereto. As illustrated in FIG. 5A, a substrate 502 may be formed. The substrate 502 may include GaN and may have a thickness approximately equal to 700 μm, for example. A semiconductor region 504 (e.g., N– semiconductor) may be formed (e.g., via an epitaxial growth process) over the substrate 502. The semiconductor region 504 may include GaN, for example.

Figure 5B:
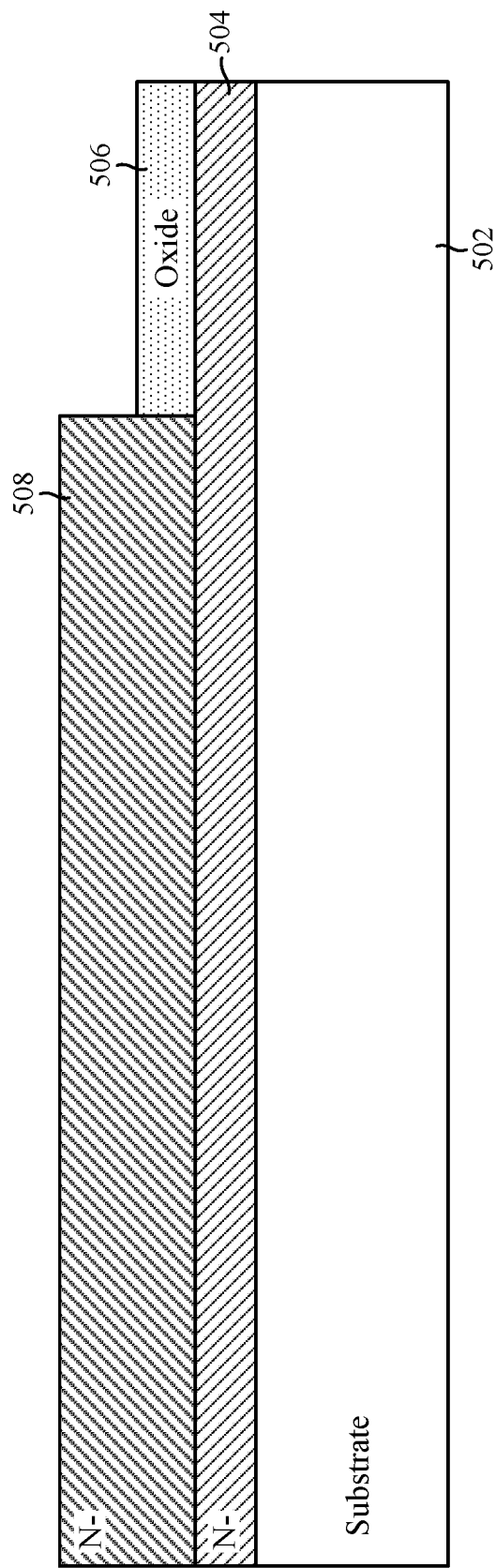

As illustrated in FIG. 5B, an oxide layer 506 (e.g., silicon dioxide ($SiO_2$)) is then deposited on the semiconductor region 504 and patterned, after which a portion of the oxide layer 506 is removed to expose a portion of the semiconductor region 504. A semiconductor region 508 (e.g., N– semiconductor) may be formed, e.g., via an epitaxial growth process, over the exposed portion of the semiconductor region 504, as illustrated. The semiconductor region 508 may include GaN, for example.

Figure 5C:
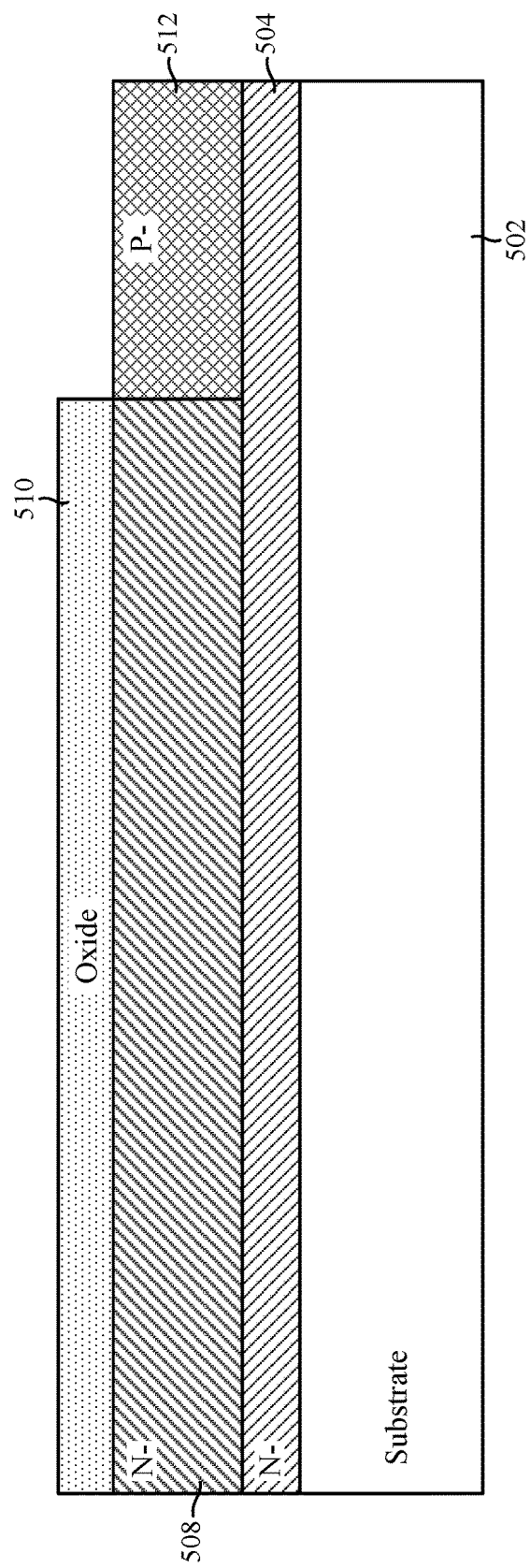

As illustrated in FIG. 5C, the remaining portion of the oxide layer 506 is removed, after which an oxide layer 510 (e.g., $SiO_2$) is deposited on the semiconductor region 508 and a portion of the semiconductor region 504. The oxide layer 510 deposited on the semiconductor region 504 is then removed, and a semiconductor region 512 (e.g., P– semiconductor) may be formed, e.g., via an epitaxial growth process, over the exposed portion of the semiconductor region 504, as illustrated. The semiconductor region 512 may include AlGaN or Mg doped P– GaN, for example. The semiconductor regions 504, 508, and 512 are used to form the semiconductor region 108 of the semiconductor device 200, as described in more detail herein.

Figure 5D:
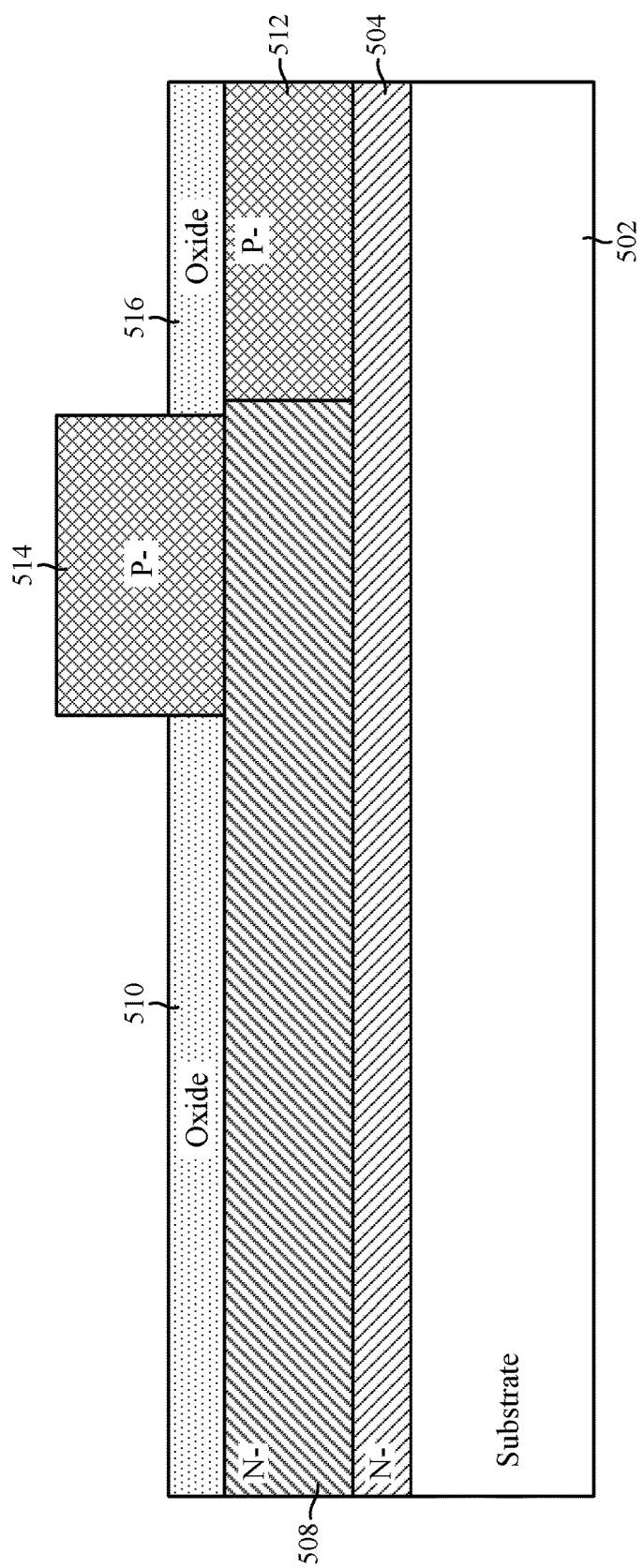

As illustrated in FIG. 5D, an oxide layer 516 (e.g., $SiO_2$) is deposited on the semiconductor region 512, and the oxide layers 510 and 516 are patterned. Due to the patterning, a portion of the oxide layer 510 is opened to expose the semiconductor region 508, after which a semiconductor region 514 (e.g., P– semiconductor) may be formed, e.g., via an epitaxial growth process, over the exposed portion of the semiconductor region 508, as illustrated. The semiconductor region 514 may include AlGaN or Mg doped P– GaN, for example.

Figure 5E:
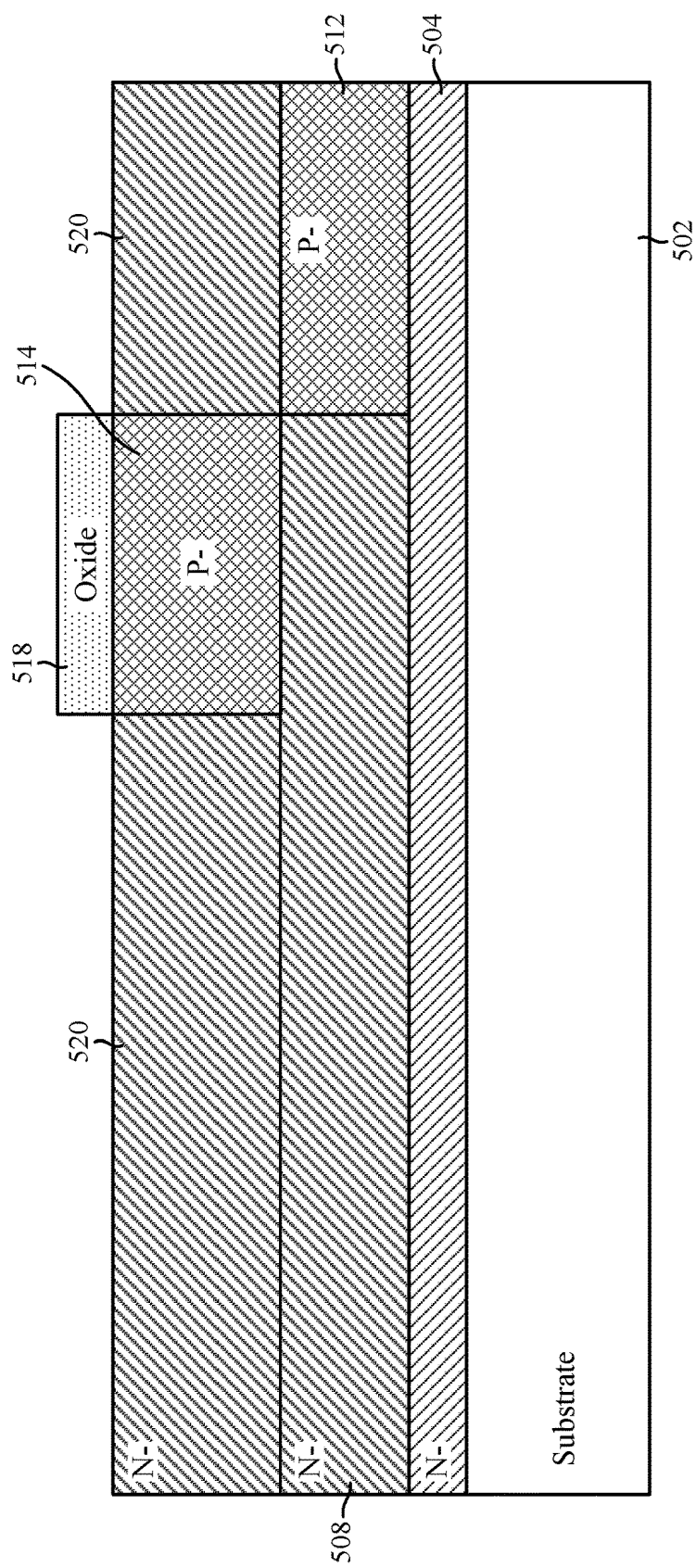

As illustrated in FIG. 5E, oxide layers 510 and 516 are removed, after which an oxide layer 518 (e.g., $SiO_2$) is deposited and patterned. Portions of the oxide layer 518 are removed to expose semiconductor regions 508 and 512, after which a semiconductor region 520 (e.g., N– semiconductor) may be formed, e.g., via an epitaxial growth process, over the exposed portions of the semiconductor regions 508 and 512, as illustrated. The semiconductor region 520 may include GaN, for example.

Figure 5F:
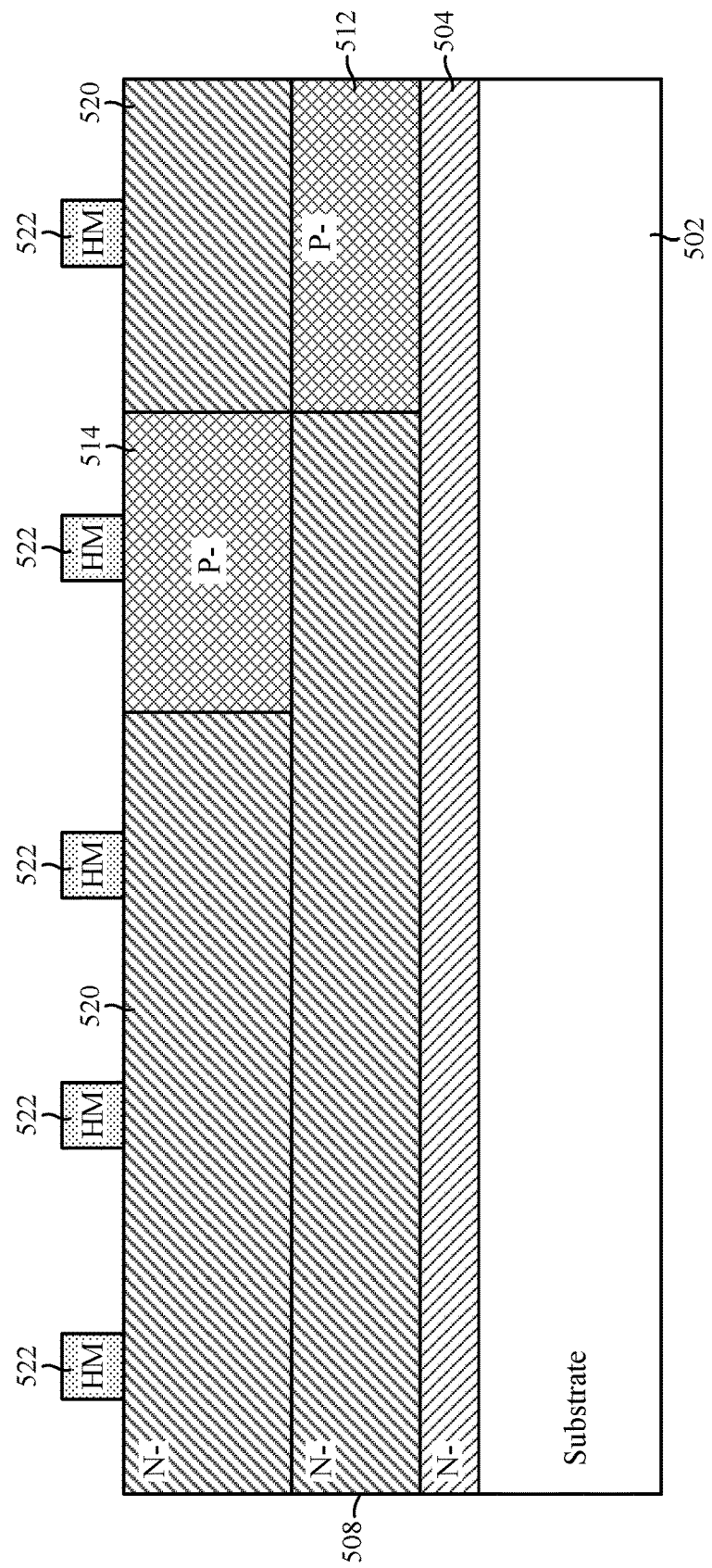

A silicon mononitride (SiN) hard mask (HM) layer 522 may be formed over the semiconductor region 520 and semiconductor region 514, after which the SiN HM layer 522 is patterned, as illustrated in FIG. 5F. The SiN HM layer 522 and semiconductor regions 514 and 520 are used to form fins 106A-C, 132, and 134 of the semiconductor device 200, as described in more detail herein.

Figure 5G:
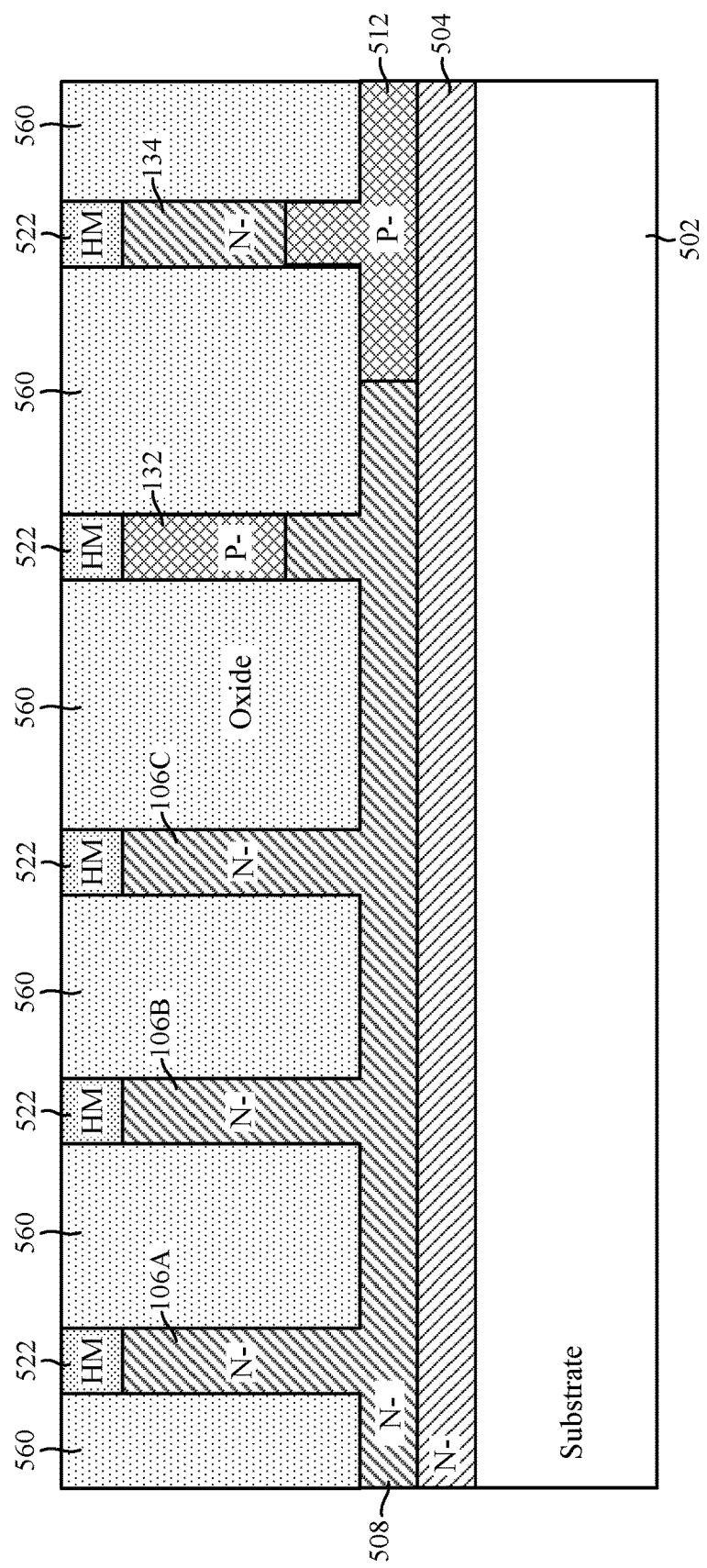

As illustrated in FIG. 5G, fins 106A, 106B, 106C, 132, and 134 are formed via etching, for example, according to the patterned SiN HM layer 522. Oxide 560 (e.g., $SiO_2$) is then deposited adjacent to the fins 106A, 106B, 106C, 132, and 134, after which a chemical mechanical planarization (CMP) process is performed, as illustrated in FIG. 5G. After the process in FIG. 5G, the semiconductor region 504 may form the semiconductor layer 122 of the semiconductor region 108, the semiconductor layer 508 may form the semiconductor portion 126 of the semiconductor layer 124 of the semiconductor region 108, and the semiconductor region 512 may form the semiconductor portion 128 of the semiconductor layer 124 of the semiconductor region 108.

Figure 5H:
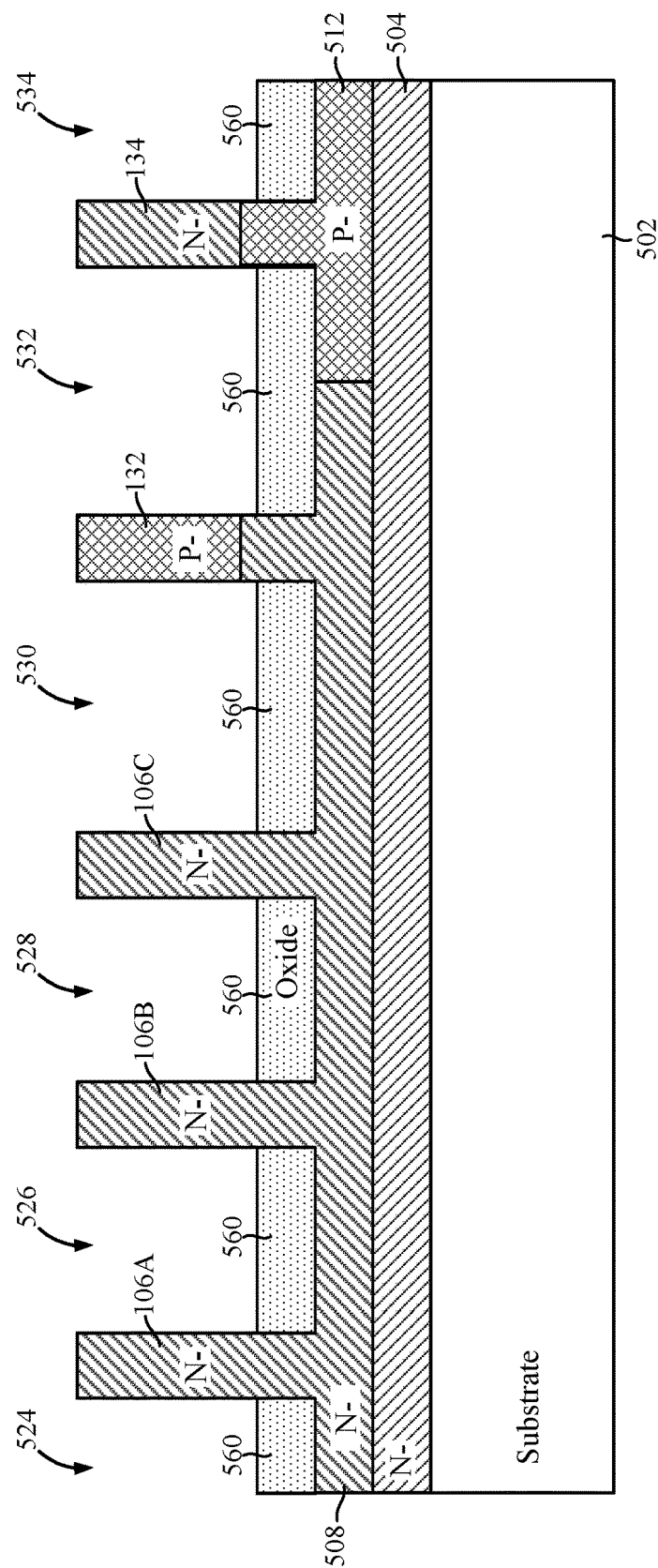
Figure 5I:
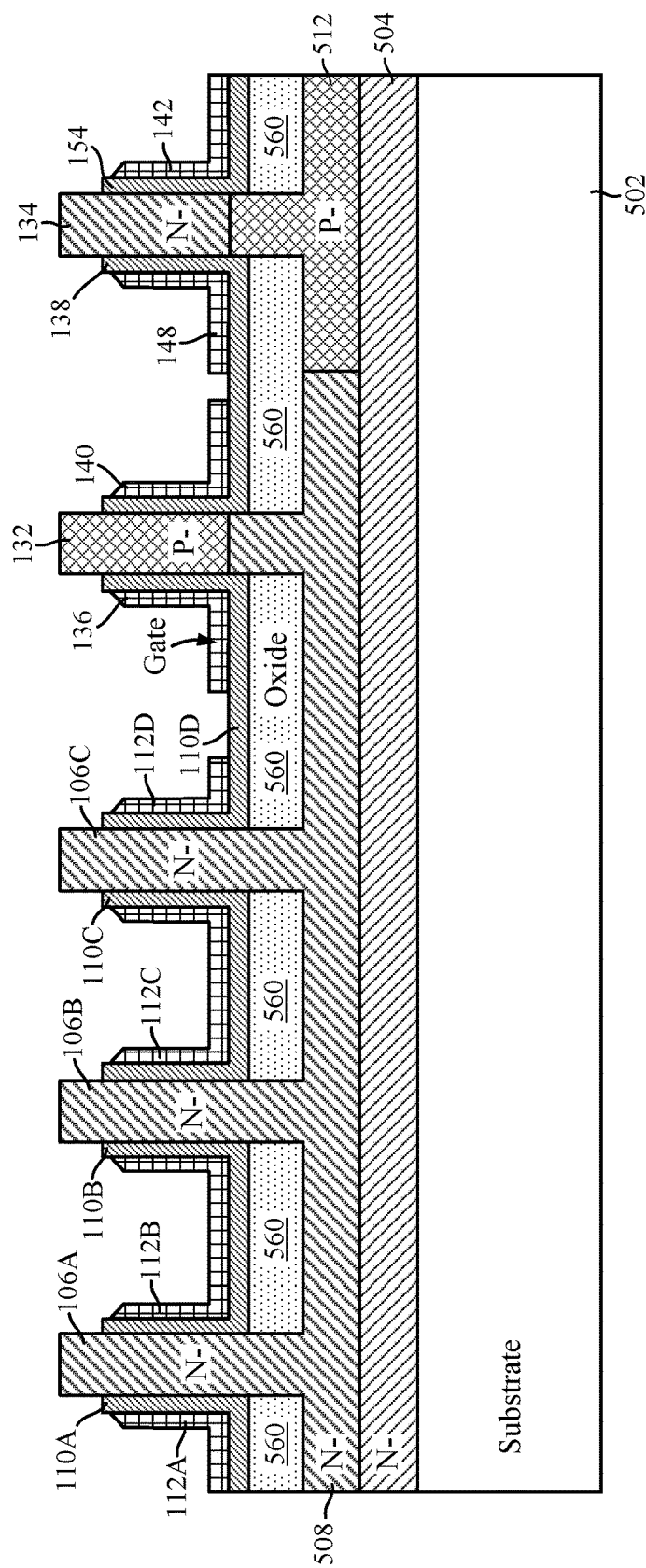

As illustrated in FIG. 5H, the SiN HM layer 522 is subsequently removed, and the different regions of the oxide 560 are etched to form shallow trench isolation (STI) regions 524, 526, 528, 530, 532, and 534. As illustrated in FIG. 5I, the oxide region 110A is deposited (or grown) adjacent to fin 106A, oxide region 110B is deposited (or grown) between fins 106A and 106B, oxide region 110C is deposited (or grown) between fins 106B and 106C, oxide region 110D is deposited (or grown) between fins 106C and 132, oxide region 138 is deposited (or grown) between fins 132 and 134, and oxide region 154 is deposited (or grown) adjacent to fin 134.

Figure 5J:
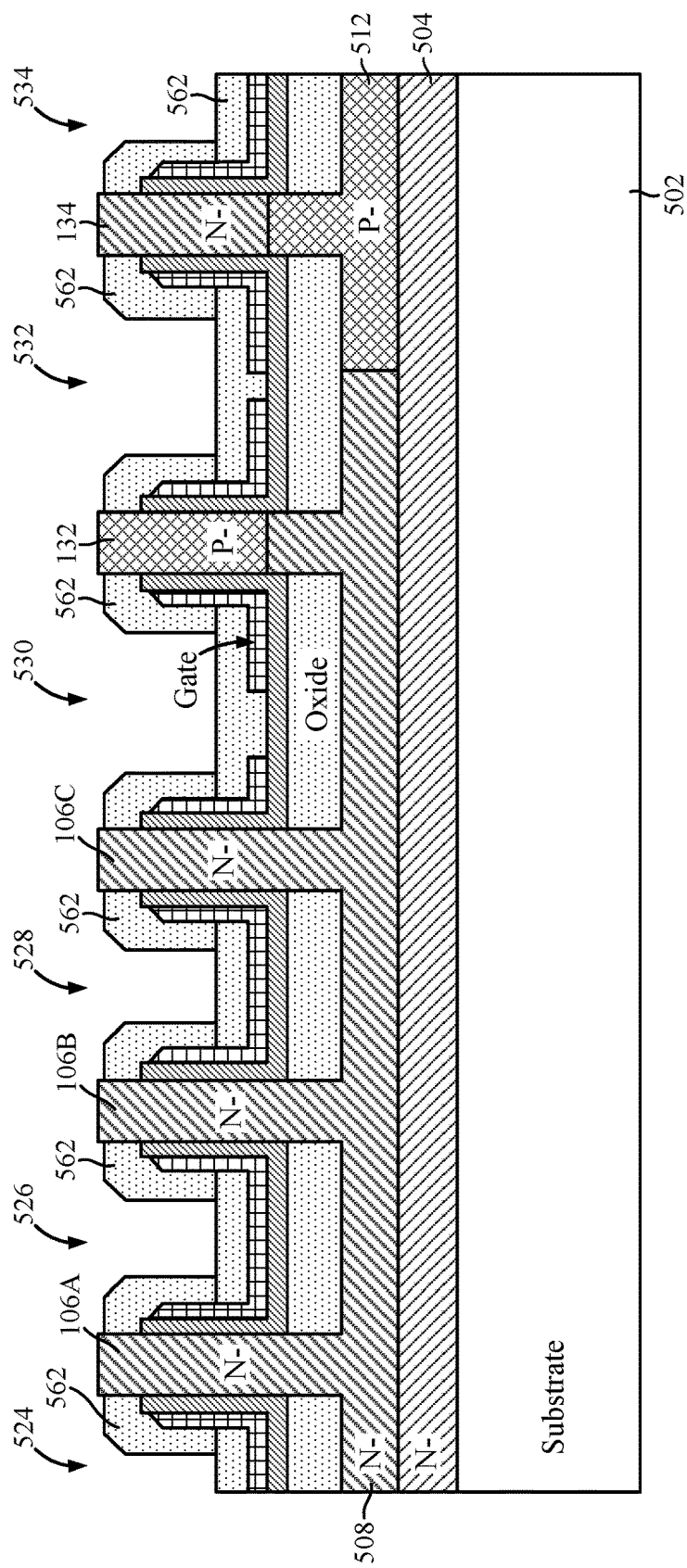

Subsequently, gate region 112A is deposited (or grown) adjacent to fin 106A, gate region 112B is deposited (or grown) between fins 106A and 106B, gate region 112C is deposited (or grown) between fins 106B and 106C, gate region 112D is deposited (or grown) adjacent to fin 106C, gate regions 136 and 140 are deposited (or grown) on opposite sides of fin 132, and gate regions 148 and 142 are deposited (or grown) on opposite sides of fin 134, as illustrated in FIG. 5I. Oxide 562 (e.g., SiO$_2$) is then deposited in the STI regions 524, 526, 528, 530, 532, and 534, and subsequently etched to expose the top of fins 106A, 106B, 106C, 132, and 134, as illustrated in FIG. 5J.

Figure 5K:
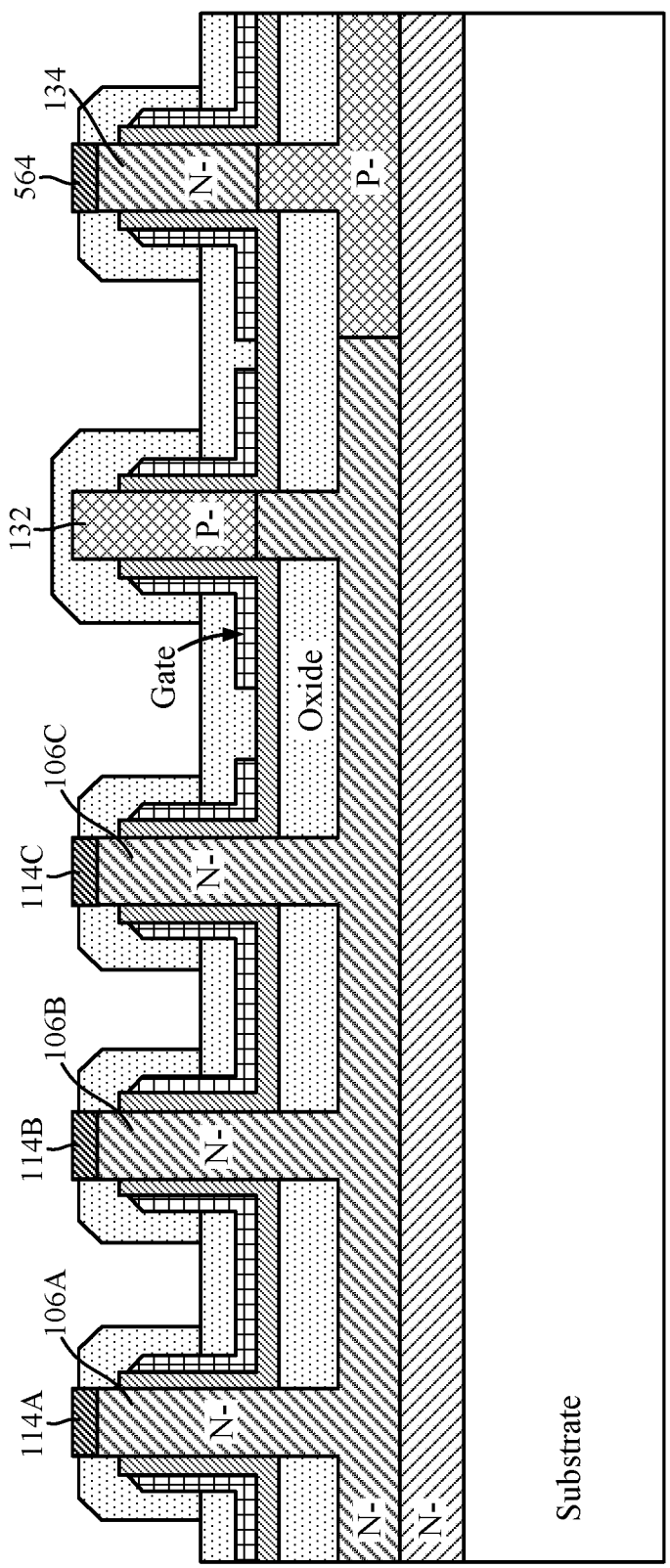

As illustrated in FIG. 5K, an oxide layer (e.g., SiO$_2$) is deposited on the top of fins 106A, 106B, 106C, 132, and 134, after which the oxide layer is patterned over fins 106A, 106B, 106C, and 134, and etched back to open the top of fins 106A, 106B, 106C, and 134. The oxide layer remains above fin 132. After a photoresist region (not shown) applied to each of fins 106A, 106B, 106C, and 134 is stripped, non-insulative regions 114A, 114B, 114C, and 564 (e.g., with n+ doping) may be formed over the top of fins 106A, 106B, 106C, and 134, respectively, as illustrated.

Figure 5L:
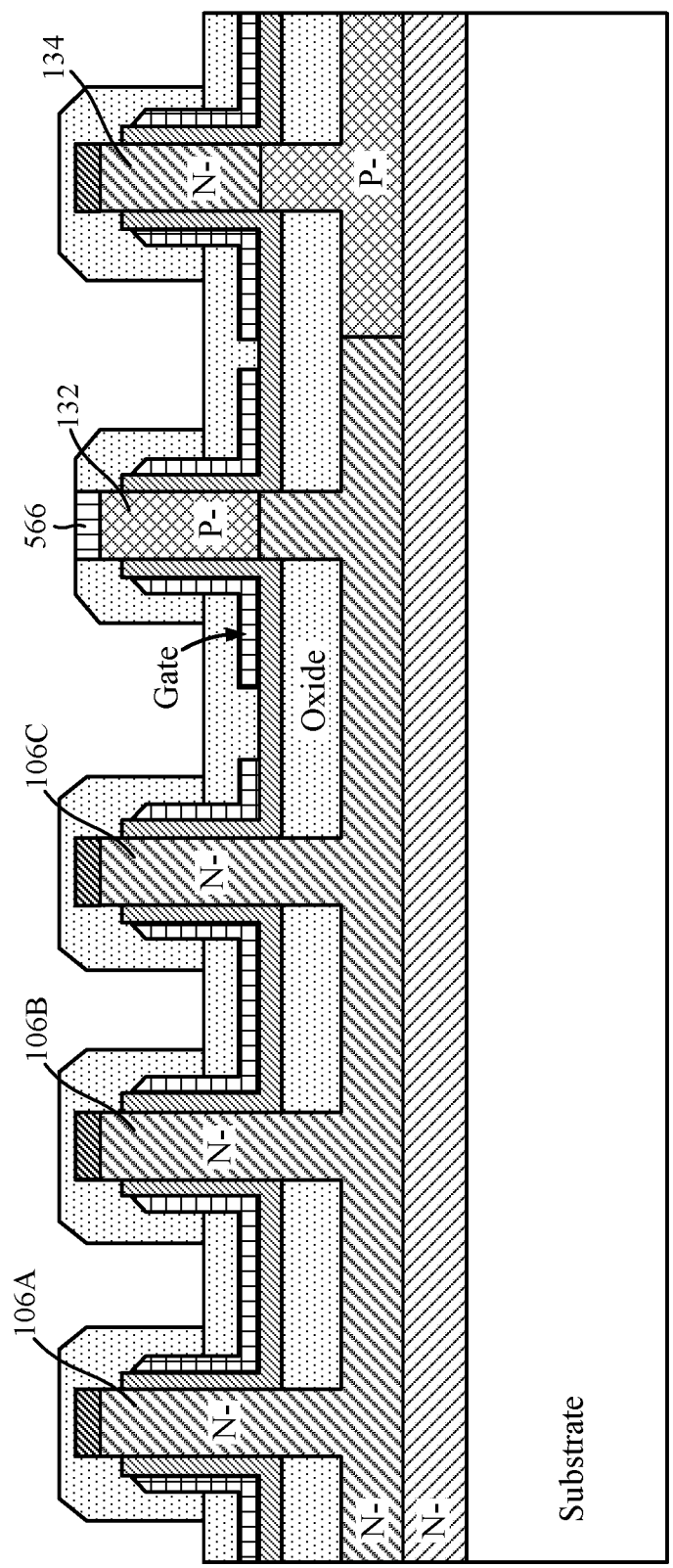

Similarly, as illustrated in FIG. 5L, an oxide layer (e.g., SiO2) is deposited on the top of fins 106A, 106B, 106C, 132, and 134, after which the oxide layer is patterned over fin 132 and etched back to open the top of fin 132. After a photoresist region (not shown) applied to fin 132 is stripped, a non-insulative region 566 (e.g., with p+ doping) may be formed over the top of fin 132, as illustrated.

Figure 5M:
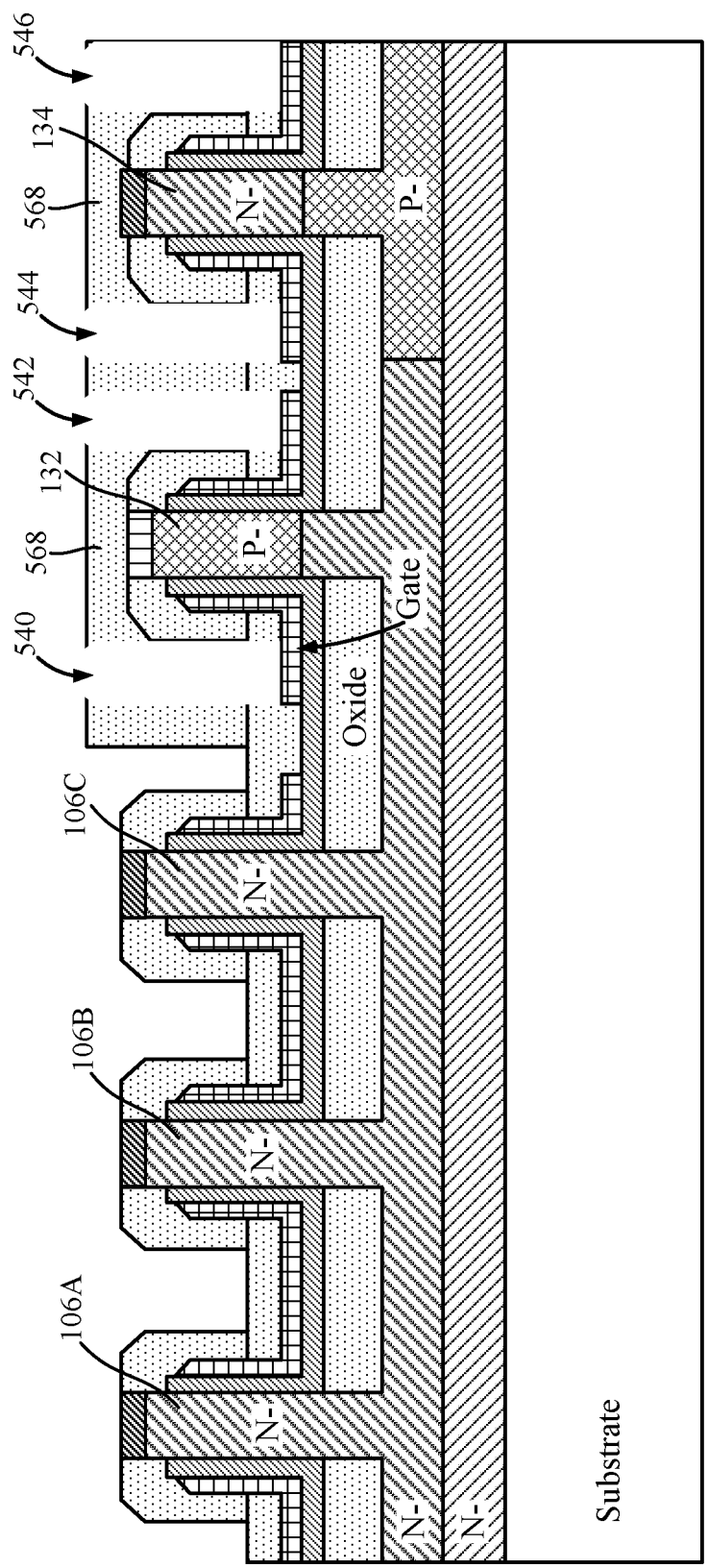

As illustrated in FIG. 5M, an oxide layer 568 (e.g., SiO$_2$) is deposited on the top of fins 106A, 106B, 106C, 132, and 134, after which the oxide deposited over fins 106A, 106B, and 106C may be patterned and etched back to open the top of fins 106A, 106B, and 106C. A photo and etching process is then performed to form the gate and source/drain contacts for the horizontal CMOS device 104. As illustrated, the oxide layer 568 over the horizontal CMOS device 104 may be etched to form trenches 540, 542, 544, and 546.

Figure 5N:
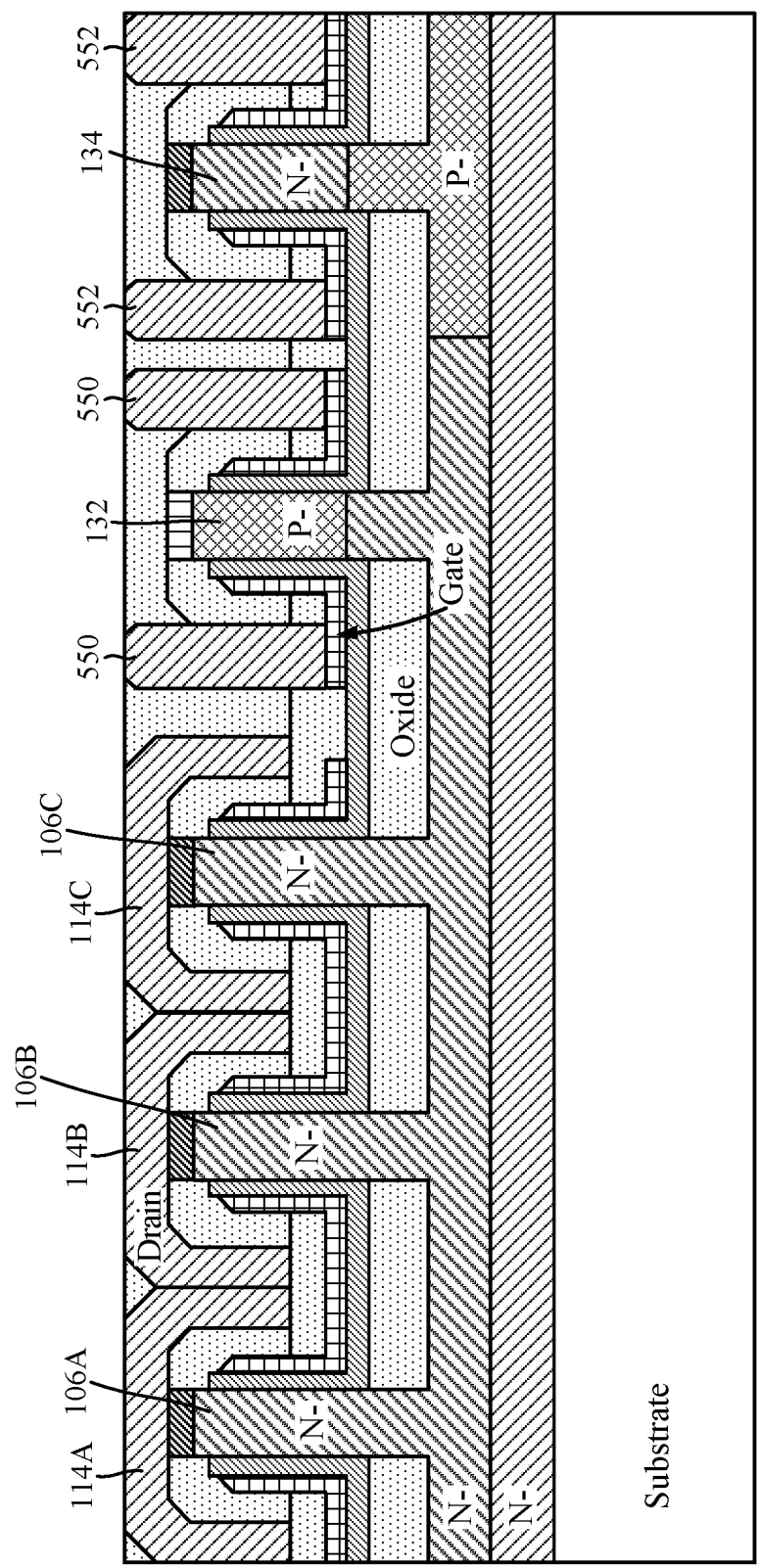
Figure 50:
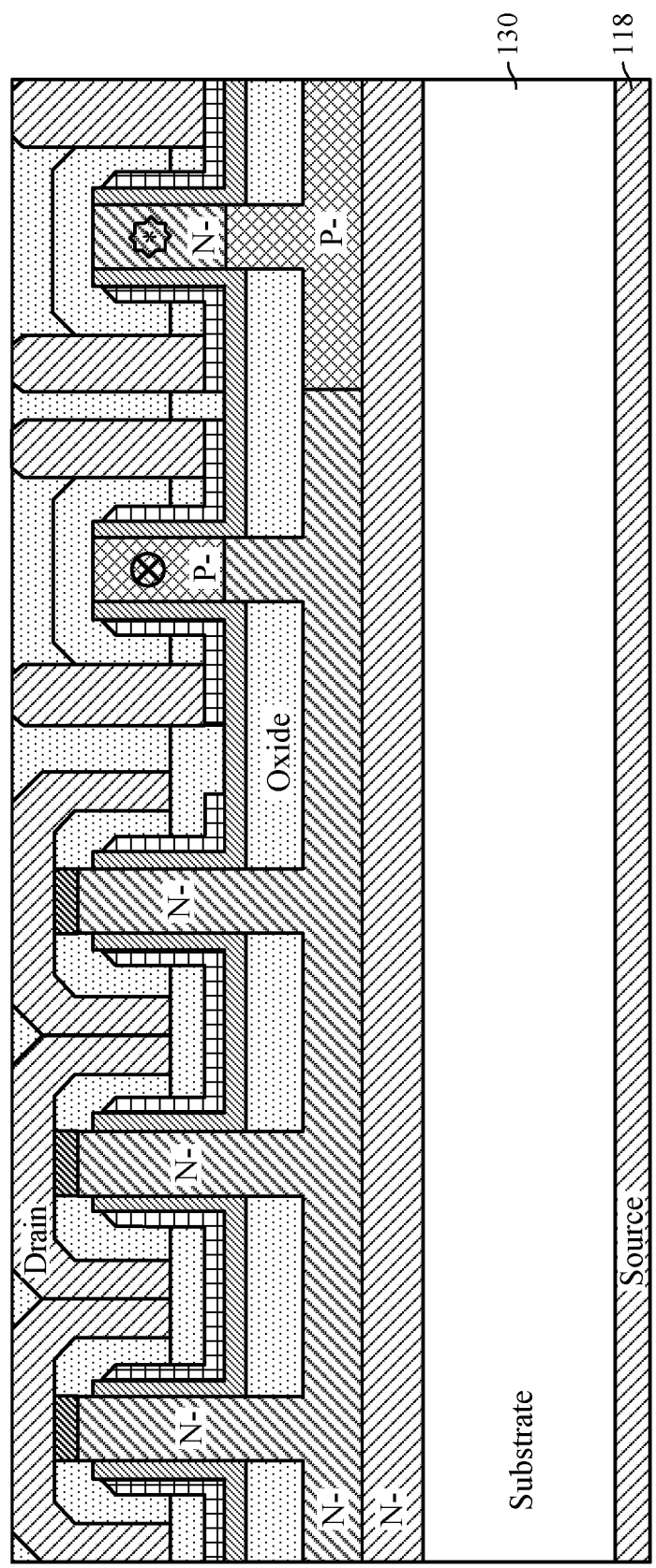

Subsequently, as illustrated in FIG. 5N, drain metallic contacts 116A, 116B, and 116C may be deposited around fins 106A, 106B, and 106C, respectively, and subsequently patterned for the vertical PA 102. Further, metallic contact material 550 may be deposited in trenches 540 and 542, and metallic contact material 552 may be deposited in trenches 544 and 546 to form the source and drain contacts for the horizontal CMOS device 104.

As illustrated in FIG. 5O, a backgrind process may be performed on the backside of the substrate 130 to reduce the thickness of the substrate 502 (e.g., from approximately 700 µm to approximately between 100 and 300 µm). A source metallic contact 118 is then deposited underneath the substrate 130 for the source contact of the vertical PA 102.

Figure 6:
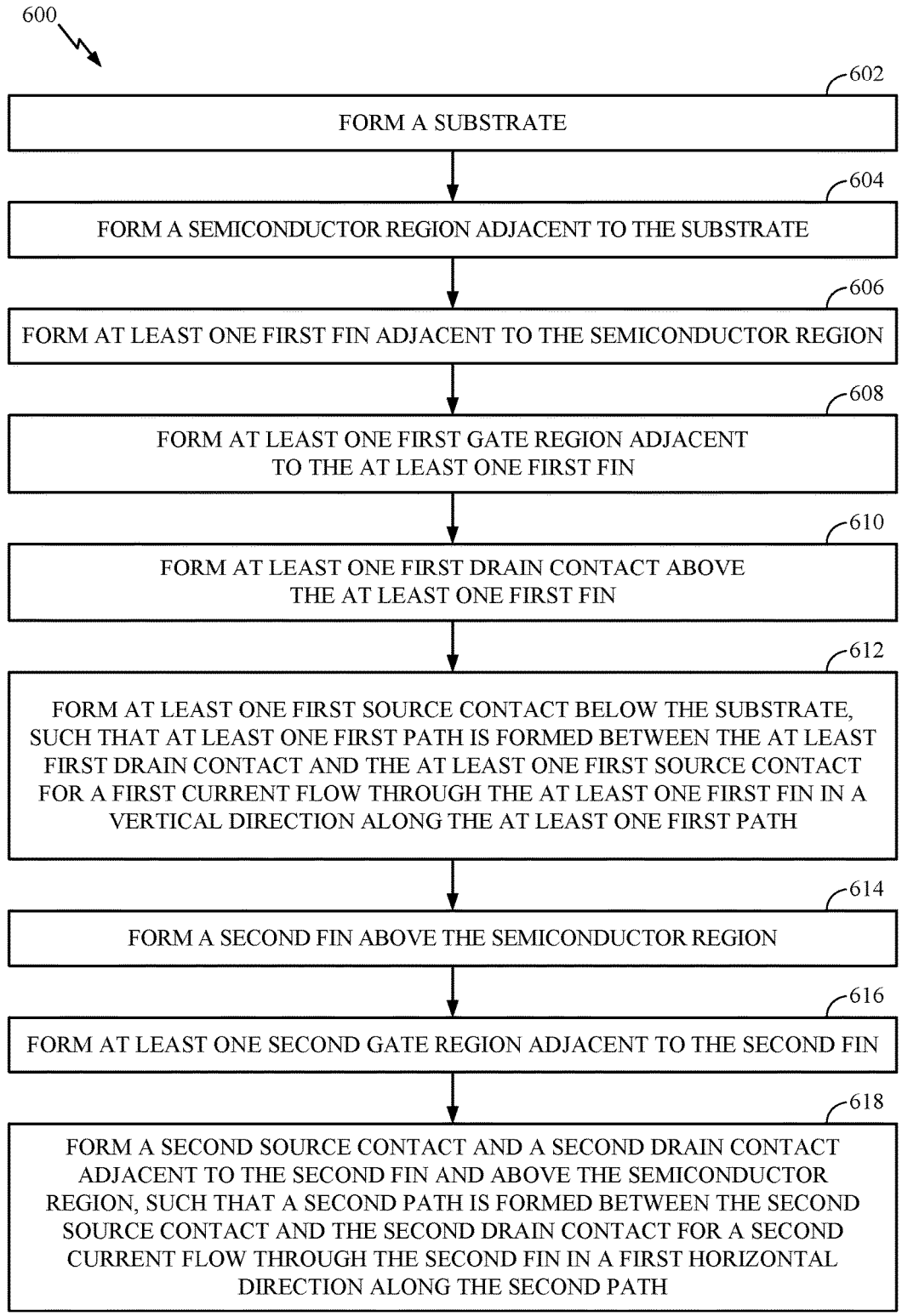
FIG. 6 is a flow diagram illustrating example operations for fabricating a semiconductor device, in accordance with certain aspects of the present disclosure.

FIG. 6 is a flow diagram of example operations 600 for fabricating a semiconductor device, in accordance with certain aspects of the present disclosure. The operations 600 may be performed, for example, by a semiconductor processing chamber.

The operations 600 begin, at block 602, by forming a substrate (e.g., substrate 130), and at block 604, forming a semiconductor region (e.g., semiconductor region 108) adjacent to the substrate. At block 606, at least one first fin (e.g., fin 106A) is formed adjacent to the semiconductor region. At block 608, at least one first gate region (e.g., gate region 112A) is formed adjacent to the at least one first fin. According to certain aspects, forming the at least one first gate region may include forming a first side of the at least one first gate region and a second side of the at least one first gate region on opposite sides of the at least one first fin.

At block 610, at least one first drain contact (e.g., drain metallic contact 116) is formed above the at least one first fin. At block 612, at least one first source contact (e.g., source metallic contact 118) is formed below the substrate, such that at least one first path (e.g., path 120A) is formed between the at least first drain contact and the at least one first source contact for a first current flow through the at least one first fin in a vertical direction along the at least one first path.

At block 614, a second fin (e.g., fin 132) is formed above the semiconductor region, and at block 616, at least one second gate region (e.g., gate region 140) is formed adjacent to the second fin. At block 618, a second source contact and a second drain contact are formed adjacent to the second fin and above the semiconductor region, such that a second path (e.g., path 144) is formed between the second source contact and the second drain contact for a second current flow through the second fin in a first horizontal direction along the second path.

According to certain aspects, operations 600 may include forming a third fin (e.g., fin 134) above the semiconductor region, forming at least one third gate region (e.g., gate region 142) adjacent to the third fin, and forming a third source contact and a third drain contact adjacent to the third fin and above the semiconductor region, such that a third path (e.g., path 146) is formed between the third source contact and the third drain contact for a third current flow through the third fin in a second horizontal direction along the third path.

According to certain aspects, the semiconductor region, the at least one first fin, and the at least one first gate region may form a vertical FinFET device, and the semiconductor region, the second fin, the at least one second gate region, the third fin, and the at least one third gate region may form a horizontal MOS device. The horizontal MOS device may be configured to control at least one parameter of the vertical FinFET device.

According to certain aspects, the semiconductor region, the at least one first fin, and the at least one first gate region may form a vertical FinFET device, and the semiconductor region, the second fin, the at least one second gate region, the third fin, and the at least one third gate region may form a horizontal CMOS device. The horizontal CMOS device may be configured to control at least one parameter of the vertical FinFET device.

According to certain aspects, forming the semiconductor region may include forming a first semiconductor layer (e.g., semiconductor layer 122) above the substrate, and forming a second semiconductor layer (e.g., semiconductor layer 124) above the first semiconductor layer.

According to certain aspects, forming the second semiconductor layer may include forming a first portion (e.g., portion 126) of the second semiconductor layer adjacent to the at least one first fin, and forming a second portion (e.g., portion 128) of the second semiconductor layer adjacent to at least one of the second fin or the third fin. In some aspects, the first portion of the second semiconductor layer may have a first doping type (e.g., n– doping), and the second portion of the second semiconductor layer may have a second doping type (e.g., p– doping) different from the first doping type. Alternatively, in some aspects, the first portion of the second semiconductor layer and the second portion of the second semiconductor layer may have a same doping type (e.g., n– doping).

According to certain aspects, forming the second semiconductor layer may include forming a first portion of the second semiconductor layer adjacent to the at least one first fin, forming a second portion of the second semiconductor layer adjacent to the second fin, and forming a third portion of the second semiconductor layer adjacent to the third fin. The first portion of the second semiconductor layer may include a first doping type (e.g., n– doping), and one of the second and third portions of the second semiconductor layer may have a second doping type (e.g., p– doping) different from the first doping type. The remaining one of the second and third portions of the second semiconductor layer may have the first doping type.

According to certain aspects, the substrate may include a wafer-level substrate, and the at least one first fin, the second fin, and/or the third fin may be formed on (e.g., share) the same wafer-level substrate. The semiconductor region may include at least one of GaN, AlGaN, InGaN, or Mg doped P–GaN. The substrate may include GaN.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor device comprising:
   a substrate;
   a semiconductor region disposed adjacent to the substrate;
   at least one first fin disposed adjacent to the semiconductor region;
   at least one first gate region disposed adjacent to the at least one first fin;
   at least one first drain contact disposed above the at least one first fin;
   at least one first source contact disposed below the substrate, wherein at least one first path is formed between the at least one first drain contact and the at least one first source contact for a first current flow through the at least one first fin in a vertical direction along the at least one first path;
   a second fin disposed above the semiconductor region;
   at least one second gate region disposed adjacent to the second fin; and
   a second source contact and a second drain contact disposed adjacent to the second fin and above the semiconductor region, wherein a second path is formed between the second source contact and the second drain contact for a second current flow through the second fin in a first horizontal direction along the second path.

2. The semiconductor device of claim 1, wherein a first side of the at least one first gate region and a second side of the at least one first gate region are on opposite sides of the at least one first fin.

3. The semiconductor device of claim 1, further comprising:
   a third fin disposed above the semiconductor region;
   at least one third gate region disposed adjacent to the third fin; and
   a third source contact and a third drain contact disposed adjacent to the third fin and above the semiconductor region, wherein a third path is formed between the third source contact and the third drain contact for a third current flow through the third fin in a second horizontal direction along the third path.

4. The semiconductor device of claim 3, wherein the semiconductor region, the at least one first fin, and the at least one first gate region form a vertical fin field-effect transistor (FinFET) device.

5. The semiconductor device of claim 4, wherein the semiconductor region, the second fin, the third fin, the at least one second gate region, and the at least one third gate region form a horizontal metal-oxide-semiconductor (MOS) device.

6. The semiconductor device of claim 5, wherein the semiconductor region comprises a first semiconductor layer disposed above the substrate and a second semiconductor layer disposed above the first semiconductor layer.

7. The semiconductor device of claim 6, wherein:
   a first portion of the second semiconductor layer is disposed adjacent to the at least one first fin; and
   a second portion of the second semiconductor layer is disposed adjacent to at least one of the second fin or the third fin.

8. The semiconductor device of claim 7, wherein:
   the first portion of the second semiconductor layer comprises a first doping type; and the second portion of the second semiconductor layer comprises a second doping type different from the first doping type.

9. The semiconductor device of claim 7, wherein:
the first portion of the second semiconductor layer and the second portion of the second semiconductor layer comprise a same doping type.

10. The semiconductor device of claim 5, wherein the horizontal MOS device is configured to control a parameter of the vertical FinFET device.

11. The semiconductor device of claim 4, wherein the semiconductor region, the second fin, the third fin, the at least one second gate region, and the at least one third gate region form a horizontal complementary metal-oxide-semiconductor (CMOS) device.

12. The semiconductor device of claim 11, wherein the semiconductor region comprises a first semiconductor layer disposed above the substrate and a second semiconductor layer disposed above the first semiconductor layer.

13. The semiconductor device of claim 12, wherein:
a first portion of the second semiconductor layer is disposed adjacent to the at least one first fin;
a second portion of the second semiconductor layer is disposed adjacent to the second fin; and
a third portion of the second semiconductor layer is disposed adjacent to the third fin.

14. The semiconductor device of claim 13, wherein:
the first portion of the second semiconductor layer comprises a first doping type; and
one of the second and third portions of the second semiconductor layer comprises a second doping type different from the first doping type.

15. The semiconductor device of claim 11, wherein the horizontal CMOS device is configured to control a parameter of the vertical FinFET device.

16. The semiconductor device of claim 1, wherein the semiconductor region comprises at least one of gallium nitride (GaN), aluminum gallium nitride (AlGaN), or indium gallium nitride (InGaN).

17. The semiconductor device of claim 1, wherein the substrate comprises gallium nitride (GaN).

18. The semiconductor device of claim 1, wherein the at least one first drain contact is patterned.

19. The semiconductor device of claim 1, wherein:
the substrate comprises a wafer-level substrate; and
the at least one first fin and the second fin share the wafer-level substrate.

\* \* \* \* \*